(12) United States Patent
Mogi (10) Patent No.: US 11,190,711 B2
(45) Date of Patent: Nov. 30, 2021

(54) SOLID-STATE IMAGE SENSOR AND ELECTRONIC DEVICE

(71) Applicant: SONY SEMICONDUCTOR SOLUTIONS CORPORATION, Kanagawa (JP)

(72) Inventor: Hideaki Mogi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 25 days.

(21) Appl. No.: 15/544,781

(22) PCT Filed: Jan. 22, 2016

(86) PCT No.: PCT/JP2016/051802
§ 371 (c)(1),
(2) Date: Jul. 19, 2017

(87) PCT Pub. No.: WO2016/125602
PCT Pub. Date: Aug. 11, 2016

(65) Prior Publication Data
US 2018/0020169 A1    Jan. 18, 2018

(30) Foreign Application Priority Data
Feb. 5, 2015 (JP) .............................. JP2015-021077

(51) Int. Cl.
*H04N 5/33* (2006.01)
*H04N 9/04* (2006.01)
(Continued)

(52) U.S. Cl.
CPC ....... *H04N 5/332* (2013.01); *H01L 27/14609* (2013.01); *H01L 27/14618* (2013.01);
(Continued)

(58) Field of Classification Search
None
See application file for complete search history.

(56) References Cited

U.S. PATENT DOCUMENTS 5,118,966 A * 6/1992 Kumada ................ G01R 29/24
327/100
2008/0290382 A1 * 11/2008 Hirota ............... H01L 27/14627
257/291
(Continued)

FOREIGN PATENT DOCUMENTS

JP    2009-099867 A    5/2009
JP    2011-082859 A    4/2011
(Continued)

OTHER PUBLICATIONS

International Search Report and Written Opinion of PCT Application No. PCT/JP2016/051802, dated Apr. 12, 2016, 02 pages of English Translation and 07 pages of ISRWO.

*Primary Examiner* — Hung Q Dang
(74) *Attorney, Agent, or Firm* — Chip Law Group (57) ABSTRACT

The present disclosure relates to a solid-state image sensor and an electronic device capable of simultaneously imaging a subject image and detecting a moving object. A solid-state image sensor according to an aspect of the present disclosure is provided with an infrared light detection unit which outputs a moving object image on the basis of infrared light out of incident light, and a visible light detection unit which outputs a subject image on the basis of visible light out of the incident light, in which the infrared light detection unit and the visible light detection unit are stacked and simultaneously output the moving object image and the subject image with the same frame and the same angle of view. The present disclosure is applicable to, for example, an electronic device having an imaging function for detecting a moving object.

8 Claims, 12 Drawing Sheets

(51) Int. Cl.
*H01L 27/146* (2006.01)
*H04N 5/14* (2006.01)

(52) U.S. Cl.
CPC .. *H01L 27/14621* (2013.01); *H01L 27/14647* (2013.01); *H01L 27/14649* (2013.01); *H01L 27/14669* (2013.01); *H04N 5/144* (2013.01); *H04N 9/04557* (2018.08)

(56) References Cited

U.S. PATENT DOCUMENTS

| | | | |
|---|---|---|---|
| 2009/0001269 A1* | 1/2009 | Tadano | H04N 5/247 250/330 |
| 2009/0173932 A1* | 7/2009 | Ohta | G01J 5/08 257/15 |
| 2010/0079481 A1* | 4/2010 | Zhang | G06K 9/2027 345/595 |
| 2011/0175981 A1 | 7/2011 | Lai et al. | |
| 2012/0242874 A1* | 9/2012 | Noudo | H01L 27/14623 348/294 |
| 2013/0063631 A1* | 3/2013 | Fujiki | H01L 27/1464 348/294 |
| 2013/0105927 A1* | 5/2013 | Shigeta | H01L 31/0547 257/432 |
| 2013/0342722 A1* | 12/2013 | Kuboi | H01L 27/1464 348/222.1 |
| 2014/0184810 A1* | 7/2014 | Sekiguchi | H01L 27/1461 348/164 |
| 2014/0204259 A1* | 7/2014 | Mitsui | B82Y 10/00 348/311 |
| 2014/0347538 A1* | 11/2014 | Toda | H01L 27/14603 348/308 |
| 2015/0002718 A1* | 1/2015 | Nomura | H04N 5/37213 348/311 |
| 2015/0256777 A1* | 9/2015 | Ishii | H04N 5/378 250/208.1 |
| 2016/0099272 A1* | 4/2016 | Wang | H01L 27/14621 257/435 |
| 2016/0111457 A1* | 4/2016 | Sekine | H01L 27/14607 257/228 |
| 2016/0165213 A1* | 6/2016 | Lee | G01S 17/89 348/46 |
| 2016/0173790 A1* | 6/2016 | Ishihara | H04N 9/67 348/164 |

FOREIGN PATENT DOCUMENTS

| | | |
|---|---|---|
| JP | 2011-198855 A | 10/2011 |
| JP | 2011-243862 A | 12/2011 |
| JP | 2012-169676 A | 9/2012 |
| JP | 2013-085215 A | 5/2013 |
| WO | 2012/004923 A1 | 1/2012 |

\* cited by examiner

| IR1 | IR1 | IR1 | IR1 |
|-----|-----|-----|-----|
| IR1 | IR2 | IR1 | IR2 |
| IR1 | IR1 | IR1 | IR1 |
| IR1 | IR2 | IR1 | IR2 |

SOLID-STATE IMAGE SENSOR AND ELECTRONIC DEVICE

CROSS REFERENCE TO RELATED APPLICATIONS

This application is a U.S. National Phase of International Patent Application No. PCT/JP2016/051802 filed on Jan. 22, 2016, which claims priority benefit of Japanese Patent Application No. JP 2015-021077 filed in the Japan Patent Office on Feb. 5, 2015. Each of the above-referenced applications is hereby incorporated herein by reference in its entirety.

TECHNICAL FIELD

The present disclosure relates to a solid-state image sensor and an electronic device, and especially relates to a solid-state image sensor and an electronic device capable of imaging a subject image and detecting movement of a subject at the same time.

BACKGROUND ART

In recent years, an image sensor typified by a CMOS image sensor which not only acquires an image signal of a subject by imaging but also acquires other physical information has been proposed.

For example, Patent Document 1 discloses an invention of an image sensor capable of switching between an imaging mode for obtaining an image signal of a subject and a moving object detection mode for detecting a moving object within an angle of view.

Also, for example, Patent Document 2 discloses an invention of a method of detecting a moving object in a solid-state imaging apparatus provided with a photodiode array corresponding to infrared rays.

CITATION LIST

Patent Document

Patent Document 1: Japanese Patent Application Laid-Open No. 2004-208059
Patent Document 2: Japanese Patent Application Laid-Open No. 11-205683

SUMMARY OF THE INVENTION

Problems to be Solved by the Invention

In the invention disclosed in Patent Document 1, it is not possible to simultaneously image the subject image and detect the moving object.

In the invention disclosed in Patent Document 2, it is not possible to image the subject image and detect the moving object at the same time, and only captured images by infrared rays may be obtained.

The present disclosure has been achieved in view of such a situation, and an object thereof is to image a subject image and detect a moving object at the same time.

Solutions to Problems

A solid-state image sensor according to a first aspect of the present disclosure is provided with an infrared light detection unit which outputs a moving object image on the basis of infrared light out of incident light, and a visible light detection unit which outputs a subject image on the basis of visible light out of the incident light, in which the infrared light detection unit and the visible light detection unit are stacked and simultaneously output the moving object image and the subject image with the same frame and the same angle of view.

The infrared light detection unit may be formed by stacking a photoelectric conversion layer which generates a charge corresponding to the infrared light out of the incident light and a dielectric layer.

The infrared light detection unit may be formed of combination of a first pixel section formed of a photoelectric conversion layer which generates the charge corresponding to the infrared light out of the incident light and a second pixel section obtained by stacking the photoelectric conversion layer and the dielectric layer.

The infrared light detection unit may be stacked on an upper layer side of the visible light detection unit.

The visible light detection unit may be formed of a PD which generates the charge corresponding to the incident light incident through a color filter colored for each pixel section.

The visible light detection unit may be formed by stacking three layers of photoelectric conversion films which generate charges corresponding to lights of different wavelengths out of the visible light.

The visible light detection unit may be formed by stacking three layers of PDs which generate charges corresponding to lights of different wavelengths out of the visible light.

The solid-state image sensor according to the first aspect of the present disclosure may further be provided with an OPB unit.

An electronic device according to a second aspect of the present disclosure is an electronic device equipped with a solid-state image sensor, in which the solid-state image sensor is provided with an infrared light detection unit which outputs a moving object image on the basis of infrared light out of incident light, and a visible light detection unit which outputs a subject image on the basis of visible light out of the incident light, and the infrared light detection unit and the visible light detection unit are stacked and simultaneously output the moving object image and the subject image with the same frame and the same angle of view.

According to the first and second aspects of the present disclosure, an infrared light detection unit which outputs a moving object image on the basis of infrared light out of emitted light and a visible light detection unit which outputs a subject image on the basis of visible light out of the incident light are stacked, and the moving object image and the subject image with the same frame and the same angle of view are simultaneously output.

Effects of the Invention

According to the first and second aspects of the present disclosure, imaging of a subject image and detection of a moving object may be performed at the same time.

MODE FOR CARRYING OUT THE INVENTION

A best mode for carrying out the present disclosure (hereinafter, referred to as an embodiment) is hereinafter described in detail with reference to the drawings.

<First Configuration Example of Solid-State Image Sensor According to Embodiment of Present Disclosure>

Figure 1:
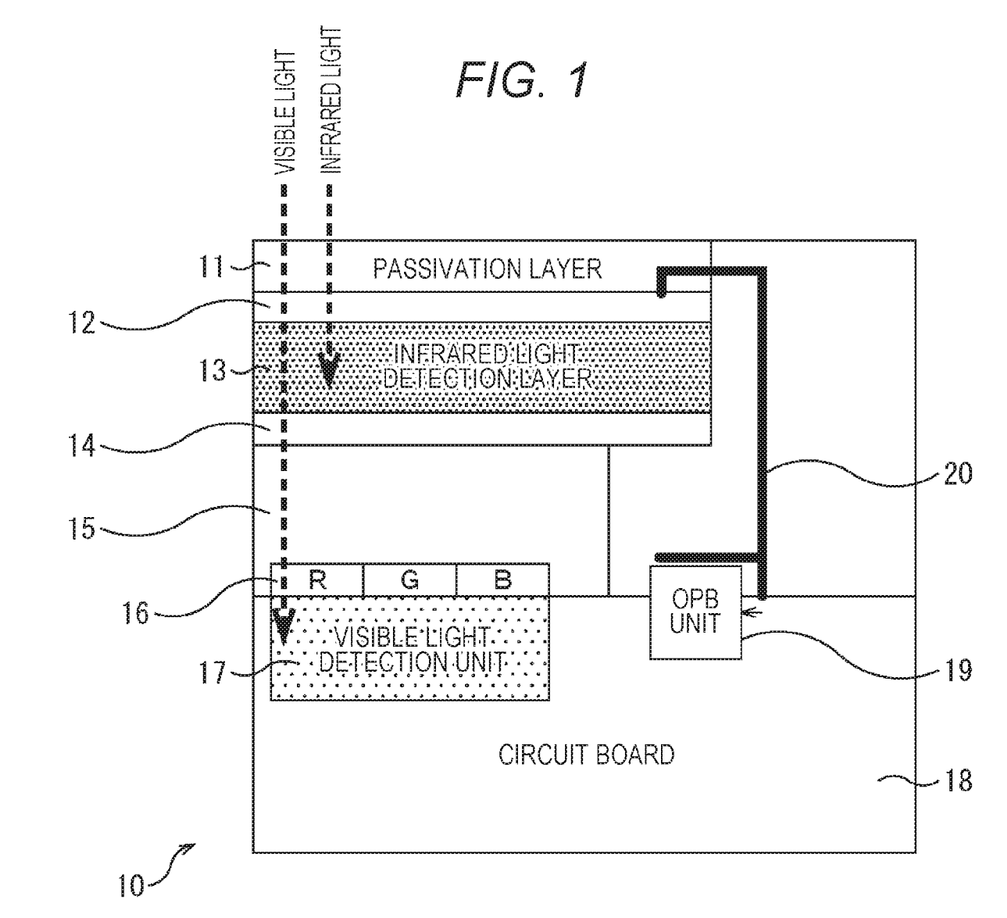
FIG. 1 is a cross-sectional view illustrating a first configuration example of a solid-state image sensor to which the present disclosure is applied.

FIG. 1 illustrates a first configuration example of a solid-state image sensor according to an embodiment of the present disclosure.

In a solid-state image sensor 10, a passivation layer 11, a transparent electrode 12, an infrared light detection layer 13, a transparent electrode 14, an insulating interlayer film 15, and a color filter (CF) 16 are formed on a circuit board 18, and a visible light detection unit 17 and an optical black (OPB) unit 19 are formed in the circuit board 18 in this order from a light incident side.

The passivation layer 11 is a protective film for protecting a light incident surface. The transparent electrodes 12 and 14 read out a charge generated in the infrared light detection layer 13 and transfer the same to a subsequent stage. The infrared light detection layer 13 generates the charge corresponding to infrared light out of incident light. The infrared light detection layer 13 also serves as an infrared cut filter for removing the infrared light from the incident light on the visible light detection unit 17 to be described later.

The color filter 16 is colored into any one of R, G, and B for each pixel. Arrangement of R, G, and B may be a Bayer array, for example.

Figure 2A:
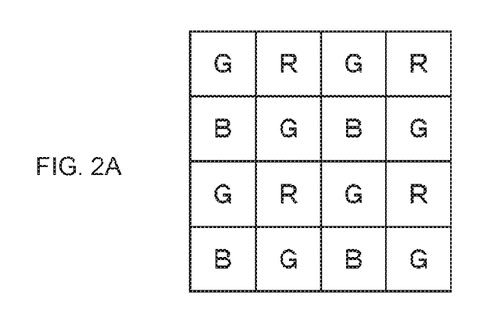
FIGS. 2A and 2B are cross-sectional views illustrating a detailed configuration example of an infrared light detection layer.
Figure 2B:
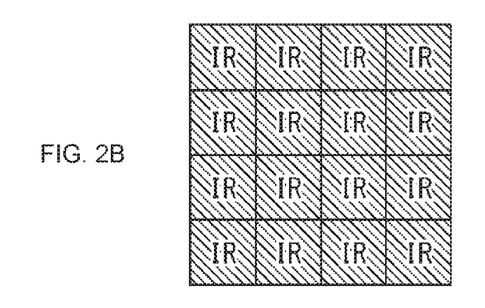

FIGS. 2A and 2B illustrate the arrangement of R, G, and B in the color filter 16 covering the visible light detection unit 17 and arrangement of respective pixels in the infrared light detection layer 13 corresponding to the same. That is, FIG. 2A illustrates the Bayer array which is an example of the arrangement of R, G, and B in the color filter 16, and FIG. 2B illustrates that the infrared light detection layer 13 may detect the infrared light in pixel units. Meanwhile, the arrangement of R, G, and B in the color filter 16 is not limited to the Bayer array and is arbitrary. Also, the color of the color filter 16 is not limited to R, G, and B, and another color combination may be adopted.

Return to FIG. 1. The visible light detection unit 17 is formed of a photodiode (PD) which generates the charge corresponding to visible light (R, G, and B components) out of the incident light and the like. The OPB unit 19 shielded from light by a light shielding film/electrode 20 is formed of the same material as that of the visible light detection unit 17 and has a photoelectric conversion function.

In the solid-state image sensor 10, the infrared light out of the incident light transmitted through the passivation layer 11 and the transparent electrode 12 is converted into the charge in the infrared light detection layer 13. Also, the visible light out of the incident light transmitted through the infrared light detection layer 13, the transparent electrode 14, the insulating interlayer film 15, and the color filter 16 is converted into the charge in the visible light detection unit 17.

The charge generated in the infrared light detection layer 13 is output to a subsequent stage through the transparent electrode 12 and the light shielding film/electrode 20 to be used as moving object detection information (moving object image). An output of the visible light detection unit 17 is used as image information (subject image). An output of the OPB unit 19 covered with the light shielding film/electrode 20 is used for setting a black level.

Figure 3:
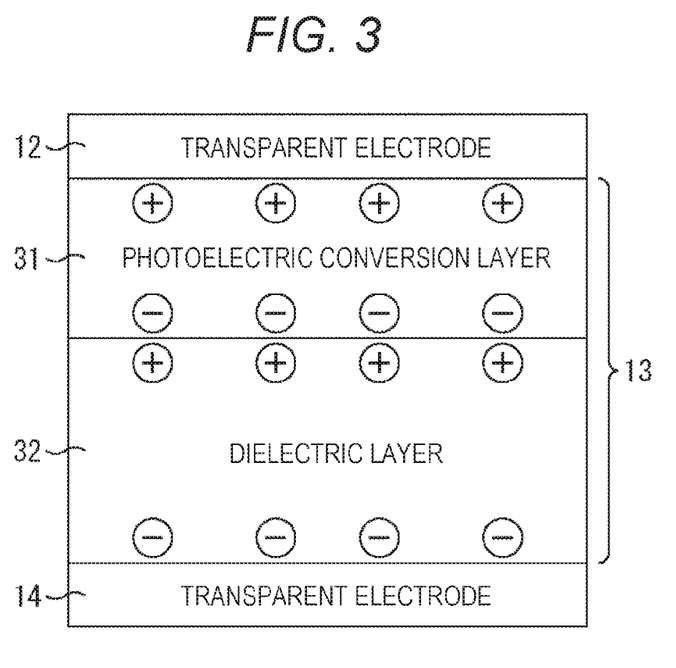
FIG. 3 is a view illustrating a response characteristic of the infrared light detection layer.

Next, FIG. 3 illustrates a configuration example of the infrared light detection layer 13 in detail. The infrared light detection layer 13 is obtained by stacking a photoelectric conversion layer 31 and a dielectric layer 32. An insulating film not illustrated is formed between the photoelectric conversion layer 31 and the dielectric layer 32.

As a material of the photoelectric conversion layer 31, for example, a material system having an absorption peak in an infrared region such as a phthalocyanine derivative and a fullerene derivative may be used. As a process of the photoelectric conversion layer 31, resistance heating evaporation, spin coating and the like may be adopted. A material of the dielectric layer 32 may be either an organic material or an inorganic material. A high-dielectric material such as an inorganic oxide film formed by sputtering deposition, for example, a high-dielectric constant material such as $TiO_2$, ZnO, and NiO is preferable. As a deposition process of the dielectric layer 32, the resistance heating evaporation, electron beam evaporation, the sputtering deposition and the like may be adopted. As a material of the transparent electrodes 12 and 14, a low-resistance transparent material system such as ITO, IZO, and IGZO is preferable.

In the photoelectric conversion layer 31, the charge is generated corresponding to the infrared light out of the incident light and is separated into a hole and an electron by exciton separation to be directed toward the transparent electrode 12 and the transparent electrode 14, respectively. However, since a carrier (electron in a case illustrated in the drawing) directed toward the transparent electrode 14 cannot get across the insulating film between the photoelectric conversion layer 31 and the dielectric layer 32, this remains on an interface with the dielectric layer 32 in the photoelectric conversion layer 31. In this case, polarization occurs in the dielectric layer 32 in proportion to the number of remaining carriers, and the carrier indirectly reaches the transparent electrode 14. That is, a current is output from the infrared light detection layer 13 to the subsequent stage. However, since the polarization of the dielectric layer 32 is immediately put into a steady state, the carrier does not flow, and the current is stopped.

Figure 4:
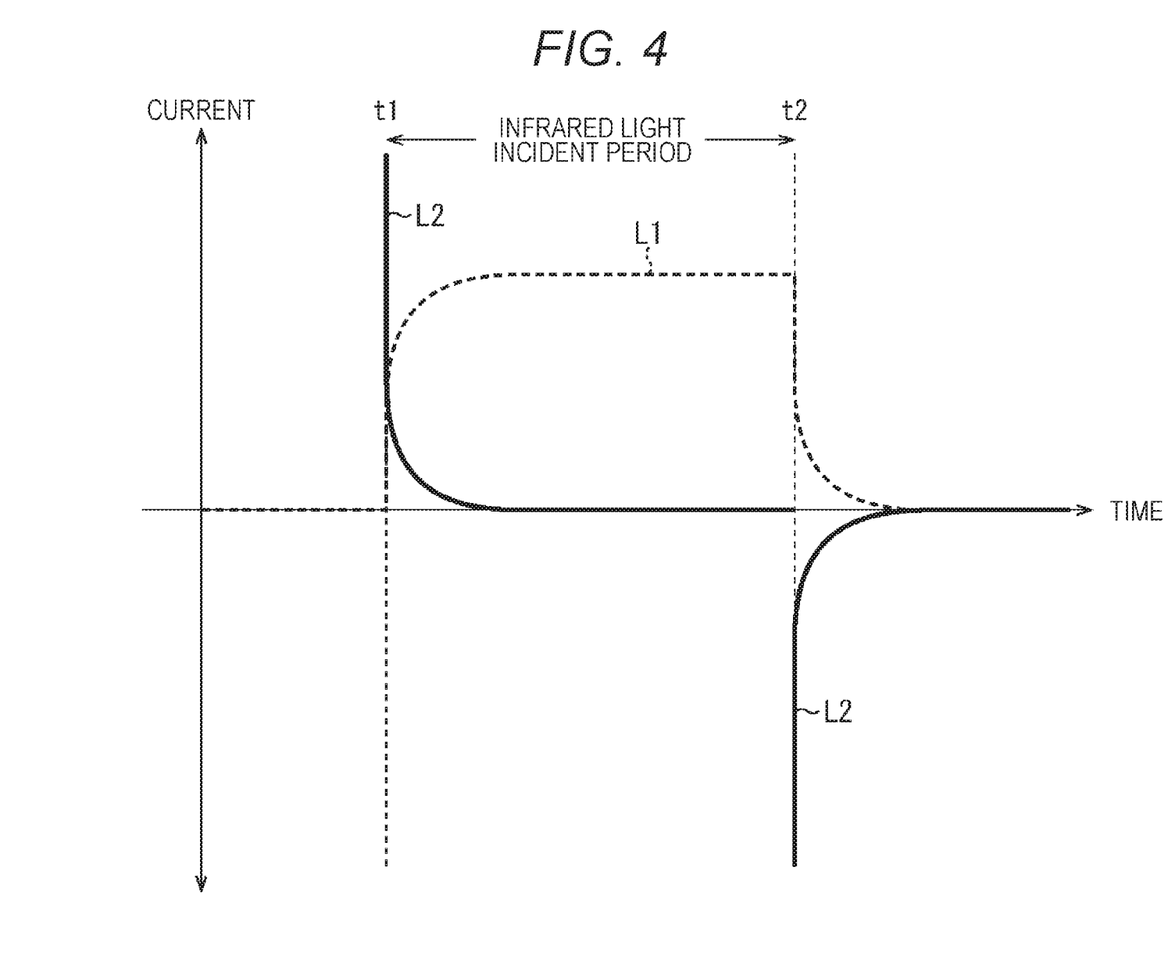
FIG. 4 is a view illustrating an example of arrangement of a color filter and the infrared light detection layer.

FIG. 4 illustrates a response characteristic of the infrared light detection layer 13 described above in which the abscissa axis represents time and the ordinate axis represents an output current. The infrared light is incident during a period from time t1 to t2 and is not incident during other periods. Meanwhile, curve L1 in the drawing represents a case where only the photoelectric conversion layer 31 is provided without the dielectric layer 32 being provided for comparison, and curve L2 represents a case of the infrared light detection layer 13 in which the photoelectric conversion layer 31 and the dielectric layer 32 are provided.

In the case of only the photoelectric conversion layer 31, a photocurrent corresponding to a photoelectric conversion amount is output during the period during which the infrared light is incident as represented by curve L1. On the other hand, in the case of the infrared light detection layer 13, as represented by curve L2, the current corresponding to an amount of polarization momentarily flows at t1, but thereafter the dielectric layer 32 is immediately put into the steady state and behaves as an insulator, so that the photocurrent does not flow. Then, at t2, the current corresponding to the amount of polarization momentarily flows. Meanwhile, a polarization speed at t1 and t2 varies depending on a dielectric constant of the dielectric layer 32, applied bias, an amount of incident light and the like.

As described above, the infrared light detection layer 13 does not output the current when the dielectric layer 32 is in the steady state and outputs the current only at the time of response when a light quantity fluctuates, so that the output thereof may be used for moving object detection. In other words, since the output changes only when the incident infrared light fluctuates, the output itself of the infrared light detection layer 13 may be used as the moving object detection information.

On the other hand, since pixel information corresponding to the visible light of the incident light is always obtained from the visible light detection unit 17, the solid-state image sensor 10 may simultaneously output moving object information and the image information. Meanwhile, signal processing such as moving object detection processing based on an output of the infrared light detection layer 13 becomes unnecessary at a subsequent stage of the solid-state image sensor 10, so that the moving object detection information may be acquired very easily. In addition, since the solid-state image sensor 10 outputs the current only in a moving object detecting state, it may be said that this is advantageous also from a viewpoint of power consumption and product life.

Figure 5A:
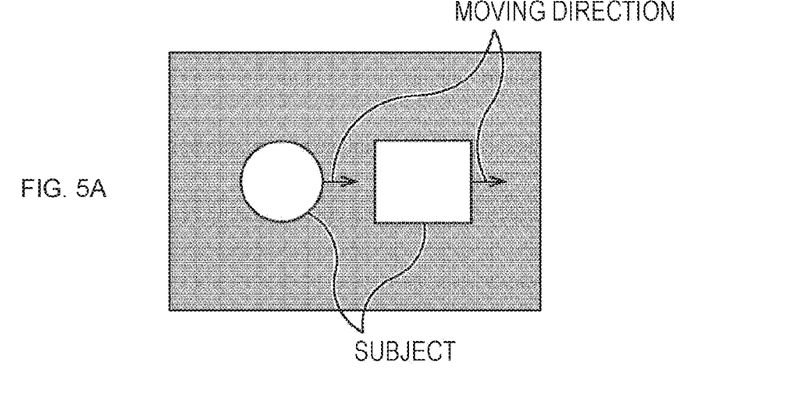
FIGS. 5A, 5B and 5C are views illustrating an example of output subject image and moving object image.
Figure 5B:
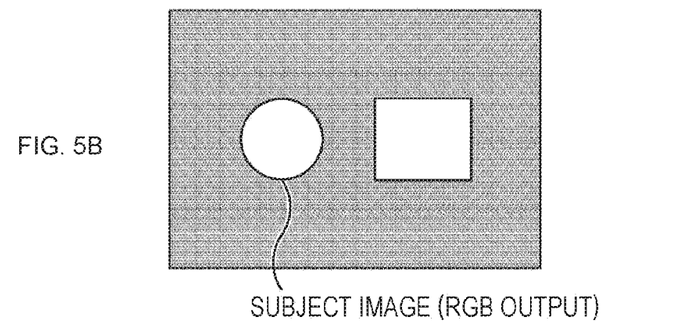
Figure 5C:
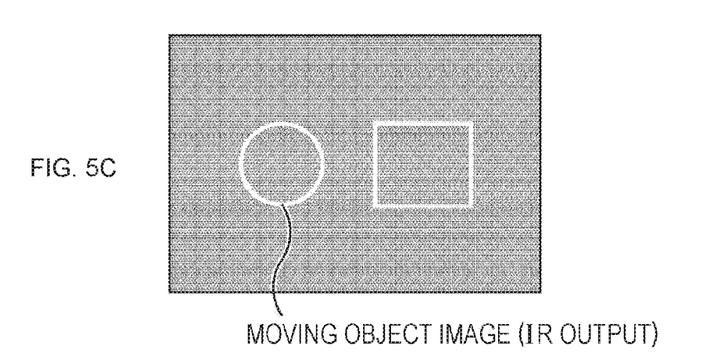

FIGS. 5A, 5B and 5C schematically illustrate the output of the solid-state image sensor 10. As illustrated in FIG. 5A, when a state in which a subject and an object are moving in a direction indicated by an arrow is imaged by the solid-state image sensor 10, the visible light detection unit 17 may obtain the subject image (RGB output) as illustrated in FIG. 5B. A moving object image (IR output) illustrating an outline of the subject as illustrated in FIG. 5C may be obtained at the same time, that is, with the same frame and the same angle of view. Meanwhile, since the infrared light detection layer 13 is formed on an upper layer side of the visible light detection unit 17, the obtained subject image is in a state in which the infrared light is cut off.

<Second Configuration Example of Solid-State Image Sensor According to Embodiment of Present Disclosure>

Figure 6:
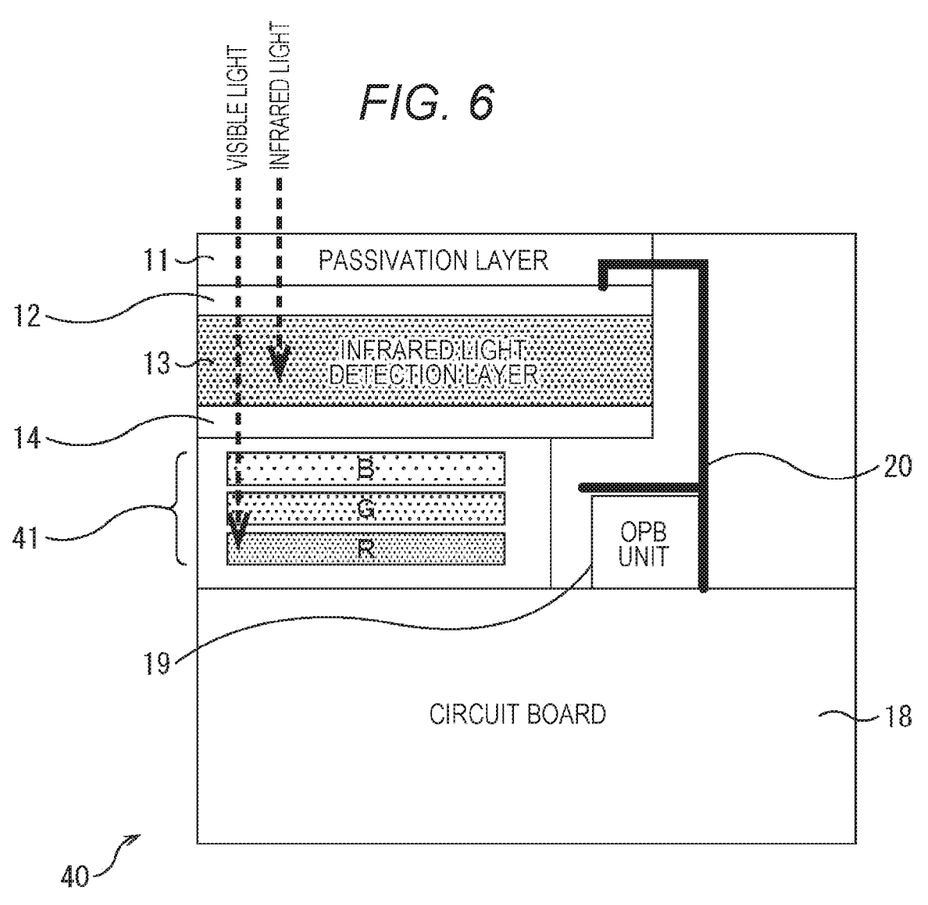
FIG. 6 is a cross-sectional view illustrating a second configuration example of the solid-state image sensor to which the present disclosure is applied.

FIG. 6 illustrates a second configuration example of the solid-state image sensor according to the embodiment of the present disclosure.

In a solid-state image sensor 40, the passivation layer 11, the transparent electrode 12, the infrared light detection layer 13, the transparent electrode 14, the photoelectric conversion film 41, and the OPB unit 19 are formed on the circuit board 18 in this order from the light incident side.

Meanwhile, since the same reference signs are assigned to components common to those of the solid-state image sensor 10 illustrated in FIG. 1, the description thereof is appropriately omitted.

A photoelectric conversion film 41 is formed by stacking three layers of organic photoelectric conversion films which generate the charges corresponding to light of any wavelength of B, G, and R out of the incident light. Therefore, in a case of the solid-state image sensor 40, each pixel outputs the charge corresponding to the light of IR, R, G, and B.

In the solid-state image sensor 40, the infrared light out of the incident light transmitted through the passivation layer 11 and the transparent electrode 12 is converted into the charge in the infrared light detection layer 13. Also, the lights of respective wavelengths of R, G, and B out of the incident light transmitted through the infrared light detection layer 13 and the transparent electrode 14 are converted into the charges in the photoelectric conversion film 41.

The charge generated in the infrared light detection layer 13 is output to a subsequent stage through the transparent electrode 12 and the light shielding film/electrode 20 to be used as moving object detection information (moving object image). An output of the photoelectric conversion film 41 is used as the image information (subject image). An output of the OPB unit 19 covered with the light shielding film/electrode 20 is used for setting a black level.

<Third Configuration Example of Solid-State Image Sensor According to Embodiment of Present Disclosure>

Figure 7:
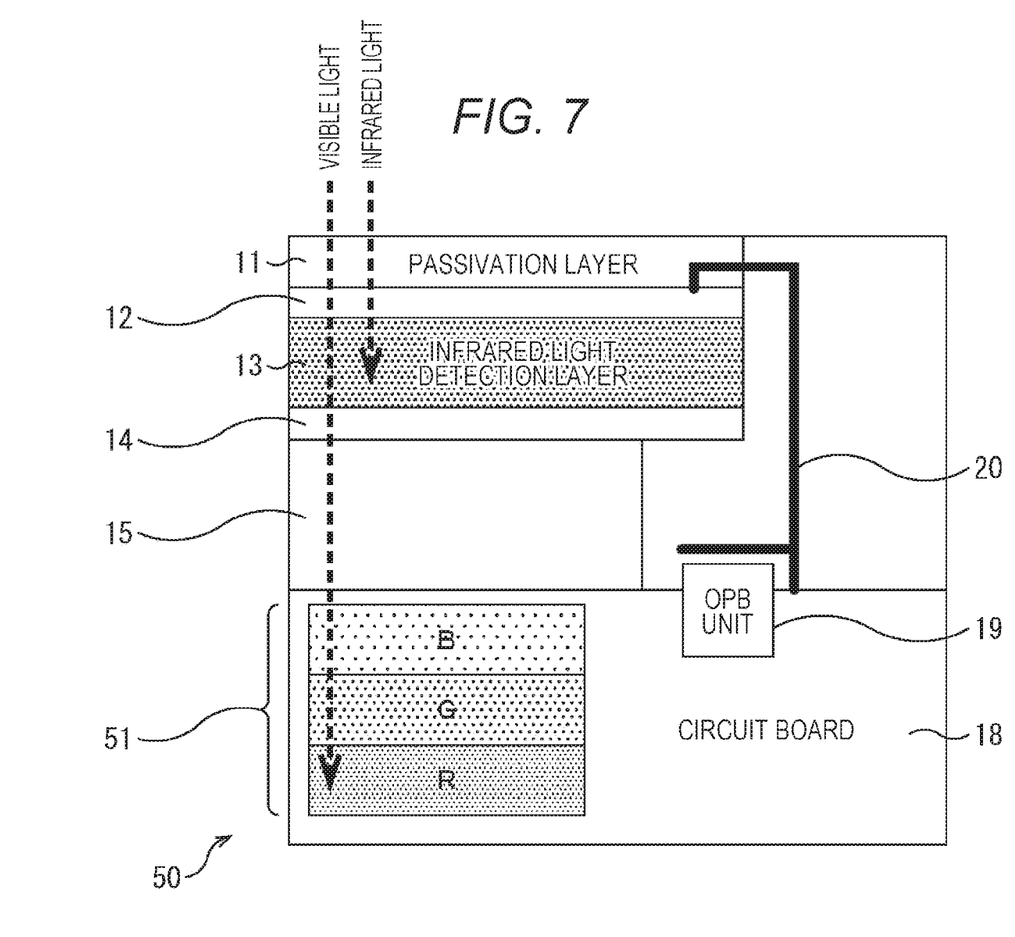
FIG. 7 is a cross-sectional view illustrating a third configuration example of the solid-state image sensor to which the present disclosure is applied.

FIG. 7 illustrates a third configuration example of the solid-state image sensor according to the embodiment of the present disclosure.

In a solid-state image sensor 50, the passivation layer 11, the transparent electrode 12, the infrared light detection layer 13, the transparent electrode 14, and the insulating interlayer film 15 are formed on the circuit board 18, and a photoelectric conversion layer 51 and the OPB unit 19 are formed in the circuit board 18 in this order from the light incident side.

The photoelectric conversion layer 51 is formed of three layers of photodiodes which generate the charges corresponding to the light of any wavelength of B, G, and R out of the incident light. Therefore, also in a case of the solid-state image sensor 50, each pixel outputs the charge corresponding to IR, R, G and B.

In the solid-state image sensor 50, the infrared light out of the incident light transmitted through the passivation layer 11 and the transparent electrode 12 is converted into the charge in the infrared light detection layer 13. Also, the lights of the respective wavelengths of R, G, and B out of the incident light transmitted through the infrared light detection layer 13, the transparent electrode 14, and the insulating interlayer film 15 are converted into the charges in the photoelectric conversion layer 51.

The charge generated in the infrared light detection layer 13 is output to a subsequent stage through the transparent electrode 12 and the light shielding film/electrode 20 to be used as moving object detection information (moving object image). An output of the photoelectric conversion layer 51 is used as the image information (subject image). An output of the OPB unit 19 covered with the light shielding film/electrode 20 is used for setting a black level.

<Variation of Infrared Light Detection Layer 13>

Figure 8A:
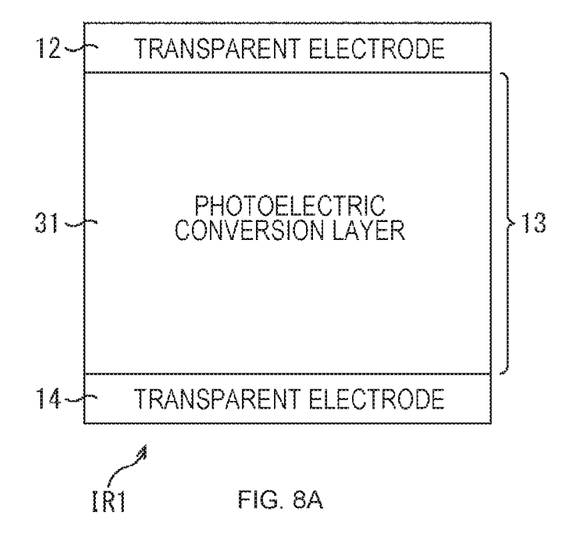
FIGS. 8A and 8B are cross-sectional views illustrating a variation of an infrared light detection layer in FIG. 1.
Figure 8B:
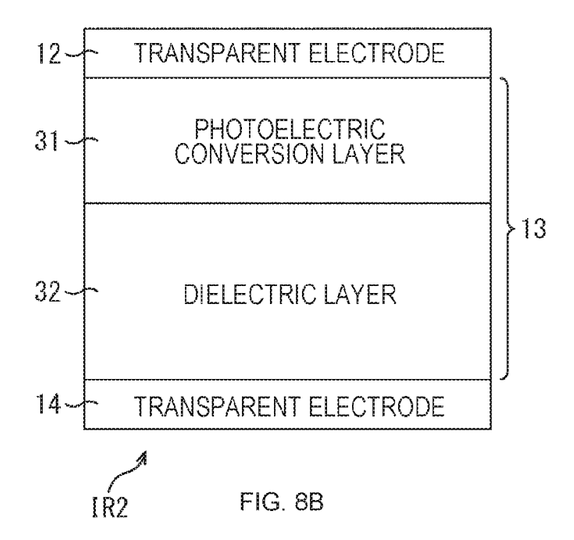

Next, FIGS. 8A and 8B illustrate a variation of the infrared light detection layer 13 which is a component of the solid-state image sensor 10, 40 or 50.

That is, although the configuration of the infrared light detection layer 13 in each pixel is the same in the above description, for example, a pixel section IR1 formed only of the photoelectric conversion layer 31 as illustrated in FIG. 8A and a pixel section IR2 formed of the photoelectric conversion layer 31 and the dielectric layer 32 as illustrated in FIG. 8B may be combined.

Figure 9:
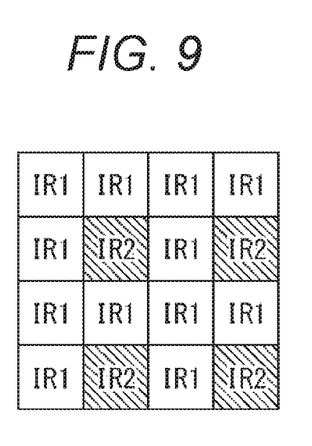
FIG. 9 is a view illustrating an example of arrangement of the variation illustrated in FIGS. 8A and 8B.

FIG. 9 illustrates an example of arrangement of the pixel sections IR1 and IR2 in the variation of the infrared light detection layer 13. FIG. 9 is an example of this and another arrangement may also be used. For example, IR2 may be appropriately arranged every four pixels, every 16 pixels and the like.

Arrangement of IR2, that is, patterning of the dielectric layer 32 may be patterning using a metal mask by an evaporation process, or patterning by a process such as dry etching of resist patterned by lithography.

Since the pixel section IR1 formed only of the photoelectric conversion layer 31 has the response characteristic represented by curve L1 in FIG. 4, an output thereof is the subject image based on an IR component of the incident light. Therefore, for example, in a case where the solid-state image sensor 10 adopts the variation of the infrared light detection layer 13, the subject image (RGB output), the subject image (IR output), and the moving object image (IR output) may be simultaneously obtained from the solid-state image sensor 10.

<Configuration Example of Imaging Apparatus Equipped with Solid-State Image Sensor 10>

Next, a configuration example of an imaging apparatus equipped with the solid-state image sensor 10 is described.

Figure 10:
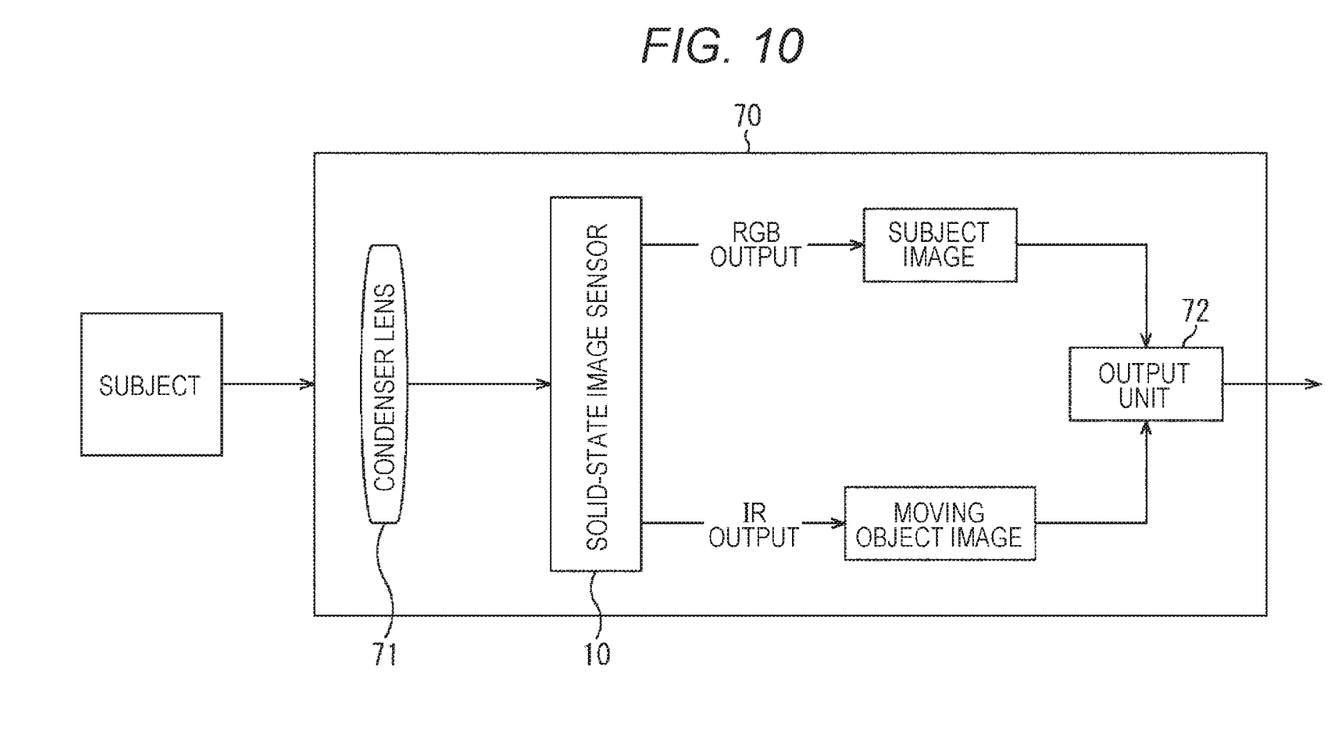
FIG. 10 is a block diagram illustrating a first configuration example of the imaging apparatus equipped with the solid-state image sensor.

FIG. 10 illustrates a first configuration example of the imaging apparatus equipped with the solid-state image sensor 10. An imaging apparatus 70 is provided with a condenser lens 71 at a precedent stage of the solid-state image sensor 10 and an output unit 72 at a subsequent stage of the solid-state image sensor 10.

In the imaging apparatus 70, the incident light condensed by the condenser lens 71 is incident on the solid-state image sensor 10. The subject image (RGB output) and the moving object image (IR output) are simultaneously output from the solid-state image sensor 10 to the output unit 72. At least one of the subject image (RGB output) and the moving object image (IR output) is output from the output unit 72 to a subsequent stage.

Figure 11:
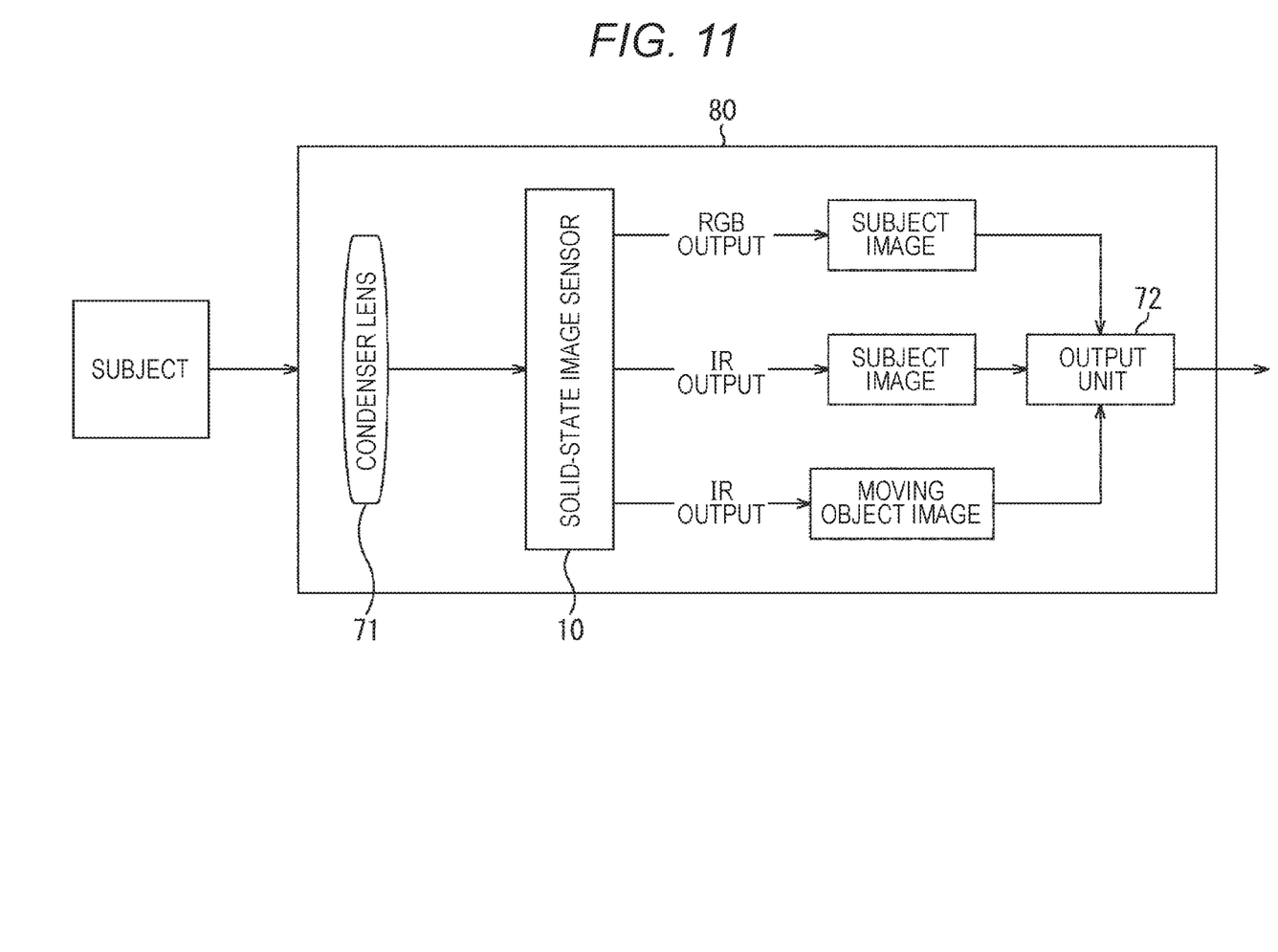
FIG. 11 is a block diagram illustrating a second configuration example of the imaging apparatus equipped with the solid-state image sensor.

FIG. 11 illustrates a second configuration example of the imaging apparatus equipped with the solid-state image sensor 10. In the solid-state image sensor 10 in an imaging apparatus 80, the variation of the infrared light detection layer 13 (formed of the pixel sections IR1 and IR2) illustrated in FIGS. 8A and 8B is adopted and the condenser lens 71 and the output unit 72 are provided on a precedent stage and a subsequent stage thereof, respectively.

In the imaging apparatus 80, the incident light condensed by the condenser lens 71 is incident on the solid-state image sensor 10. The subject image (RGB output), the subject image (IR output), and the moving object image (IR output) are simultaneously output from the solid-state image sensor 10 to the output unit 72. At least one of the subject image (RGB output), the subject image (IR output), and the moving object image (IR output) is output from the output unit 72 to the subsequent stage.

Meanwhile, the imaging apparatuses 70 and 80 described above may be equipped with the solid-state image sensor 40 or 50.

<Usage Example of Solid-State Image Sensor>

Figure 12:
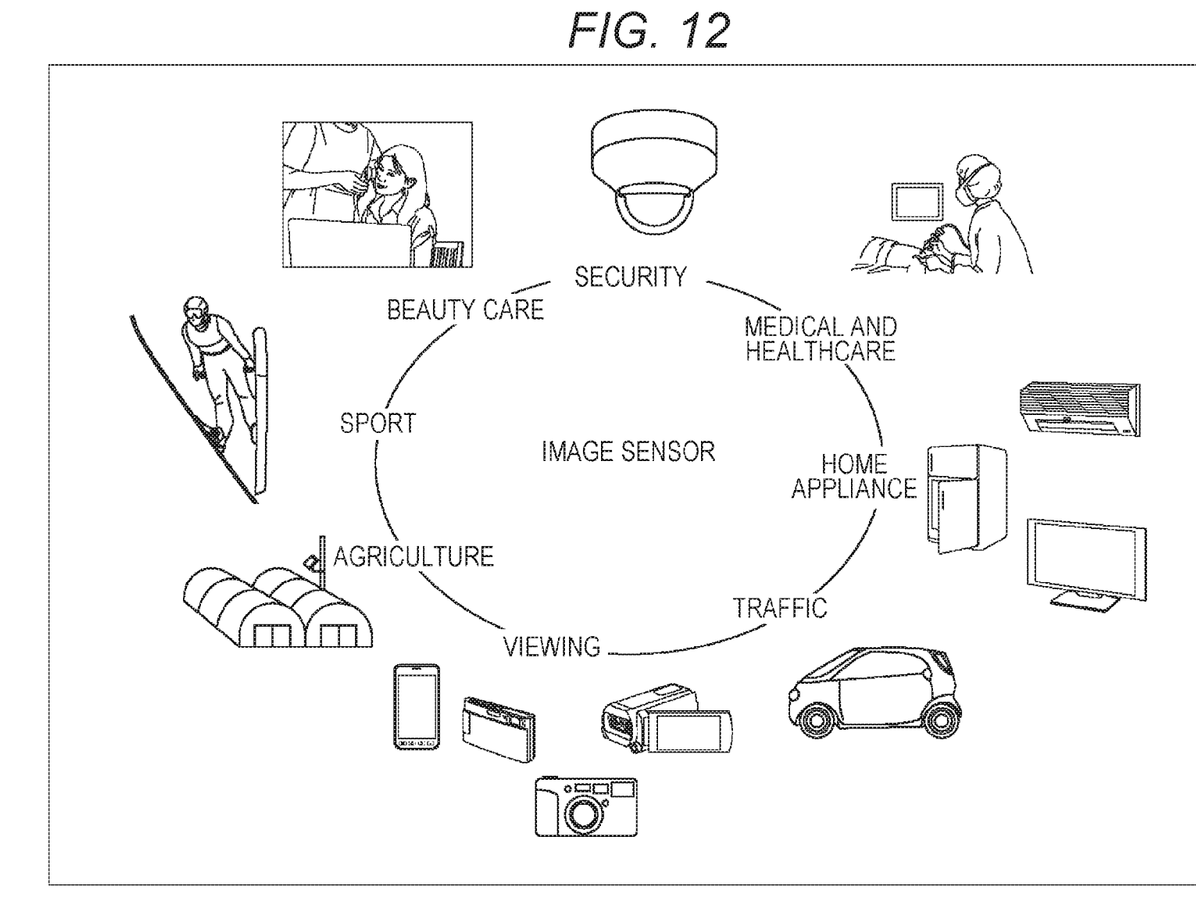
FIG. 12 is a view illustrating a usage example of the solid-state image sensor of the present disclosure.

FIG. 12 is a view illustrating a usage example of using the above-described solid-state image sensor.

The above-described solid-state image sensor may be used in various cases in which light such as the visible light, the infrared light, ultraviolet light, and X-ray is sensed as described below, for example.

A device which takes an image to be used for viewing such as a digital camera and a portable device with a camera function A device for traffic purpose such as an in-vehicle sensor which takes images of the front, rear, surroundings, interior and the like of an automobile, a surveillance camera for monitoring traveling vehicles and roads, and a ranging sensor which measures a distance between vehicles and the like for safe driving such as automatic stop and recognition of a driver's condition A device used for home appliances such as a television, a refrigerator, and an air conditioner which shoots a user gesture and operate the device according to the gesture A device for medical and healthcare purposes such as an endoscope and a device which performs angiography by receiving infrared light A device for security purpose such as a surveillance camera for security and a camera for person authentication A device for beauty care such as a skin measuring instrument for photographing skin and a microscope for photographing scalp A device for sporting purpose such as an action camera and a wearable camera for sporting purpose A device for agricultural purpose such as a camera for monitoring a condition of fields and crops Meanwhile, the embodiment of the present disclosure is not limited to the above-described embodiment, and various modifications may be made without departing from the gist of the present disclosure.

The present disclosure may also have the following configurations.

(1)

A solid-state image sensor including:

an infrared light detection unit which outputs a moving object image on the basis of infrared light out of incident light; and a visible light detection unit which outputs a subject image on the basis of visible light out of the incident light, in which the infrared light detection unit and the visible light detection unit are stacked and simultaneously output the moving object image and the subject image with the same frame and the same angle of view.

(2)

The solid-state image sensor according to (1) described above, in which the infrared light detection unit is formed by stacking a photoelectric conversion layer which generates a charge corresponding to the infrared light out of the incident light and a dielectric layer.

(3)

The solid-state image sensor according to (1) or (2) described above, in which the infrared light detection unit is formed of combination of a first pixel section formed of a photoelectric conversion layer which generates the charge corresponding to the infrared light out of the incident light and a second pixel section obtained by stacking the photoelectric conversion layer and the dielectric layer.

(4)

The solid-state image sensor according to any one of (1) to (3) described above, in which the infrared light detection unit is stacked on an upper layer side of the visible light detection unit.

(5)

The solid-state image sensor according to any one of (1) to (4) described above, in which the visible light detection unit is formed of a PD which generates the charge corresponding to the incident light incident through a color filter colored for each pixel section.

(6)

The solid-state image sensor according to any one of (1) to (4) described above, in which the visible light detection unit is formed by stacking three layers of photoelectric conversion films which generate charges corresponding to lights of different wavelengths out of the visible light.

(7)

The solid-state image sensor according to any one of (1) to (4) described above, in which the visible light detection unit is formed by stacking three layers of PDs which generate charges corresponding to lights of different wavelengths out of the visible light.

(8)

The solid-state image sensor according to any one of (1) to (7) described above, further including:

an OPB unit.

(9)

An electronic device equipped with a solid-state image sensor, in which the solid-state image sensor is provided with an infrared light detection unit which outputs a moving object image on the basis of infrared light out of incident light, and a visible light detection unit which outputs a subject image on the basis of visible light out of the incident light, and the infrared light detection unit and the visible light detection unit are stacked and simultaneously output the moving object image and the subject image with the same frame and the same angle of view.

REFERENCE SIGNS LIST

10 Solid-state image sensor
11 Passivation layer
12 Transparent electrode
13 Infrared light detection layer
14 Transparent electrode
15 Insulating interlayer film
16 Color filter
17 Visible light detection unit
18 Circuit board
19 OPB unit
20 Light shielding film/electrode
31 Photoelectric conversion layer
32 Dielectric layer
40 Solid-state image sensor
41 Photoelectric conversion film
50 Solid-state image sensor
51 Photoelectric conversion layer
70 Imaging apparatus
71 Condenser lens
72 Infrared cut filter
73 Output unit

The invention claimed is:

1. A solid-state image sensor, comprising:
a photoelectric conversion layer;
a transparent electrode on the photoelectric conversion layer, wherein the transparent electrode is different from the photoelectric conversion layer;
a dielectric layer;
an insulating film;
an infrared light detection unit that comprises a combination of a first pixel section and a second pixel section, wherein the infrared light detection unit is configured to:
  generate a first charge based on a change in an amount of infrared light out of incident light; and
  output the first charge as a moving object image, wherein
    the first pixel section comprises only the photoelectric conversion layer configured to generate the first charge corresponding to the infrared light,
    the second pixel section comprises a stack of the photoelectric conversion layer, the insulating film, and the dielectric layer,
    the insulating film is between the photoelectric conversion layer and the dielectric layer,
    the first charge is output through the dielectric layer in case the amount of the infrared light changes,
    the dielectric layer is configured to prevent the output of the first charge in case the amount of the infrared light is unchanged, and
    the moving object image is associated with a moving object;
a visible light detection unit configured to output a subject image based on visible light out of the incident light, wherein
  the subject image is associated with a subject,
  the subject is different from the moving object,
  the infrared light detection unit and the visible light detection unit are stacked,
  the infrared light detection unit and the visible light detection unit are configured to concurrently output the moving object image and the subject image, and
  the moving object image and the subject image are concurrently output with a same frame and a same angle of view;
an optical black (OPB) unit configured to output black level setting information of the solid-state image sensor; and
a light shielding electrode different from the transparent electrode, wherein
  the light shielding electrode shields the OPB unit from the incident light, and
  the first charge generated by the infrared light detection unit is output via the transparent electrode and the light shielding electrode.

2. The solid-state image sensor according to claim 1, further comprising a passivation layer configured to protect a light incident surface of the solid-state image sensor, wherein the passivation layer, the transparent electrode, the photoelectric conversion layer, the insulating film, the dielectric layer, and the visible light detection unit are stacked in this order from a light incidence side of the incident light.

3. The solid-state image sensor according to claim 1, wherein the photoelectric conversion layer is on the dielectric layer, and the photoelectric conversion layer is configured to generate the first charge corresponding to the infrared light.

4. The solid-state image sensor according to claim 3, wherein the infrared light detection unit is stacked on an upper layer side of the visible light detection unit.

5. The solid-state image sensor according to claim 3, further comprising a color filter for each of the first pixel section and the second pixel section,
wherein the visible light detection unit comprises a photodiode (PD) configured to generate a second charge corresponding to the incident light which is incident through the color filter for each of the first pixel section and the second pixel section.

6. The solid-state image sensor according to claim 3, wherein the visible light detection unit comprises a stack of three layers of photoelectric conversion films configured to generate charges corresponding to lights of different wavelengths of the visible light.

7. The solid-state image sensor according to claim 3, wherein the visible light detection unit comprises a stack of three layers of photodiodes (PDs) configured to generate charges corresponding to lights of different wavelengths of the visible light.

8. An electronic device, comprising:
a solid-state image sensor that comprises:
a photoelectric conversion layer;
a transparent electrode on the photoelectric conversion layer, wherein the transparent electrode is different from the photoelectric conversion layer;
a dielectric layer;
an insulating film;
an infrared light detection unit that comprises a combination of a first pixel section and a second pixel section, wherein the infrared light detection unit is configured to:
generate a charge based on a change in an amount of infrared light out of incident light; and
output the charge as a moving object image, wherein
the first pixel section comprises only the photoelectric conversion layer configured to generate the charge corresponding to the infrared light,
the second pixel section comprises a stack of the photoelectric conversion layer, the insulating film, and the dielectric layer,
the insulating film is between the photoelectric conversion layer and the dielectric layer,
the charge is output through the dielectric layer in case the amount of the infrared light changes,
the dielectric layer is configured to prevent the output of the charge in case the amount of the infrared light is unchanged, and
the moving object image is associated with a moving object;
a visible light detection unit configured to output a subject image based on visible light out of the incident light, wherein
the subject image is associated with a subject,
the subject is different from the moving object,
the infrared light detection unit and the visible light detection unit are stacked,
the infrared light detection unit and the visible light detection unit are configured to concurrently output the moving object image and the subject image, and
the moving object image and the subject image are concurrently output with a same frame and a same angle of view;
an optical black (OPB) unit configured to output black level setting information of the solid-state image sensor; and
a light shielding electrode different from the transparent electrode, wherein
the light shielding electrode shields the OPB unit from the incident light, and
the charge generated by the infrared light detection unit is output via the transparent electrode and the light shielding electrode.

* * * * *